(12) United States Patent
Reinhold et al.

(10) Patent No.: US 8,349,081 B2
(45) Date of Patent: Jan. 8, 2013

(54) GAS DISTRIBUTOR WITH PRE-CHAMBERS ARRANGED IN PLANES

(75) Inventors: Markus Reinhold, Wohnsitz (DE);
Peter Baumann, Wohnsitz (DE);
Gerhard Karl Strauch, Wohnsitz (DE)

(73) Assignee: Aixtron SE, Herzogenrath (DE)

( * ) Notice: Subject to any disclaimer, the term of this patent is extended or adjusted under 35 U.S.C. 154(b) by 892 days.

(21) Appl. No.: 11/815,091

(22) PCT Filed: Jan. 5, 2006

(86) PCT No.: PCT/EP2006/050049
§ 371 (c)(1),
(2), (4) Date: Feb. 24, 2012

(87) PCT Pub. No.: WO2006/082117
PCT Pub. Date: Aug. 10, 2006

(65) Prior Publication Data
US 2009/0013930 A1    Jan. 15, 2009

(30) Foreign Application Priority Data

Jan. 31, 2005 (DE) .......................... 10 2005 004 312

(51) Int. Cl.
*C23C 16/00* (2006.01)
*C23F 1/00* (2006.01)
*H01L 21/306* (2006.01)

(52) U.S. Cl. ............... 118/715; 156/345.33; 156/345.34

(58) Field of Classification Search .................. 118/715; 156/345.33, 345.34
See application file for complete search history.

(56) References Cited

U.S. PATENT DOCUMENTS
5,453,124 A    9/1995    Moslehi et al.
(Continued)

FOREIGN PATENT DOCUMENTS
EP    0687749 A1    12/1995

OTHER PUBLICATIONS

Aixtron AG., PCT/EP2006/050049, International Search Report and Written Opinion, Jun. 1, 2006, 10pp, ISA/EP, European Patent Office.

(Continued)

*Primary Examiner* — Rakesh Dhingra
(74) *Attorney, Agent, or Firm* — Tarek N. Fahmi

(57) ABSTRACT

A gas distributor for a CVD or OVPD reactor comprises two or more gas volumes (1, 2) into each of which opens a feed pipe (3, 4) for a process gas, each gas volume (1, 2) being connected to a plurality of corresponding process gas outlets (6, 7) which open into the bottom (5) of the gas distributor. In order to increase the homogeneity of the gas composition, the two gas volumes (1, 2) comprise pre-chambers (10, 10', 11) located in a first common plane (8) and a plurality of gas distribution chambers (12, 13) each associated with a gas volume are provided in a second plane (9') adjacent to the bottom of the gas distributor. The pre-chambers (10, 10', 11) and gas distribution chambers (12, 13) associated with each gas volume (1, 2) are connected with connection channels (14, 15).

14 Claims, 8 Drawing Sheets

U.S. PATENT DOCUMENTS

| | | | |
|---|---|---|---|
| 5,871,586 A | | 2/1999 | Crawley et al. |
| 6,245,192 B1 | | 6/2001 | Dhindsa et al. |
| 6,436,193 B1 | * | 8/2002 | Kasai et al. .................. 118/715 |
| 6,800,139 B1 | * | 10/2004 | Shinriki et al. ............... 118/715 |
| 6,921,437 B1 | * | 7/2005 | DeDontney et al. .......... 118/715 |
| 7,481,886 B2 | * | 1/2009 | Kato et al. .................... 118/715 |
| 2002/0059904 A1 | * | 5/2002 | Doppelhammer ............ 118/715 |
| 2004/0103844 A1 | * | 6/2004 | Chou et al. ................... 118/715 |
| 2004/0149212 A1 | | 8/2004 | Cho et al. |

OTHER PUBLICATIONS

Aixtron AG; International Application No. PCT/EP2006/050049 filed Jan. 5, 2006; International Preliminary Report on Patentability; mailed Jul. 31, 2007; 7 pages.
EP Office Action dated Jan. 22, 2008; 4 pages.
Reply to EP Office Action dated Jun. 5, 2008; 21 pages.
Request for Entry into European Phase dated Aug. 10, 2007; 21 pages.

* cited by examiner

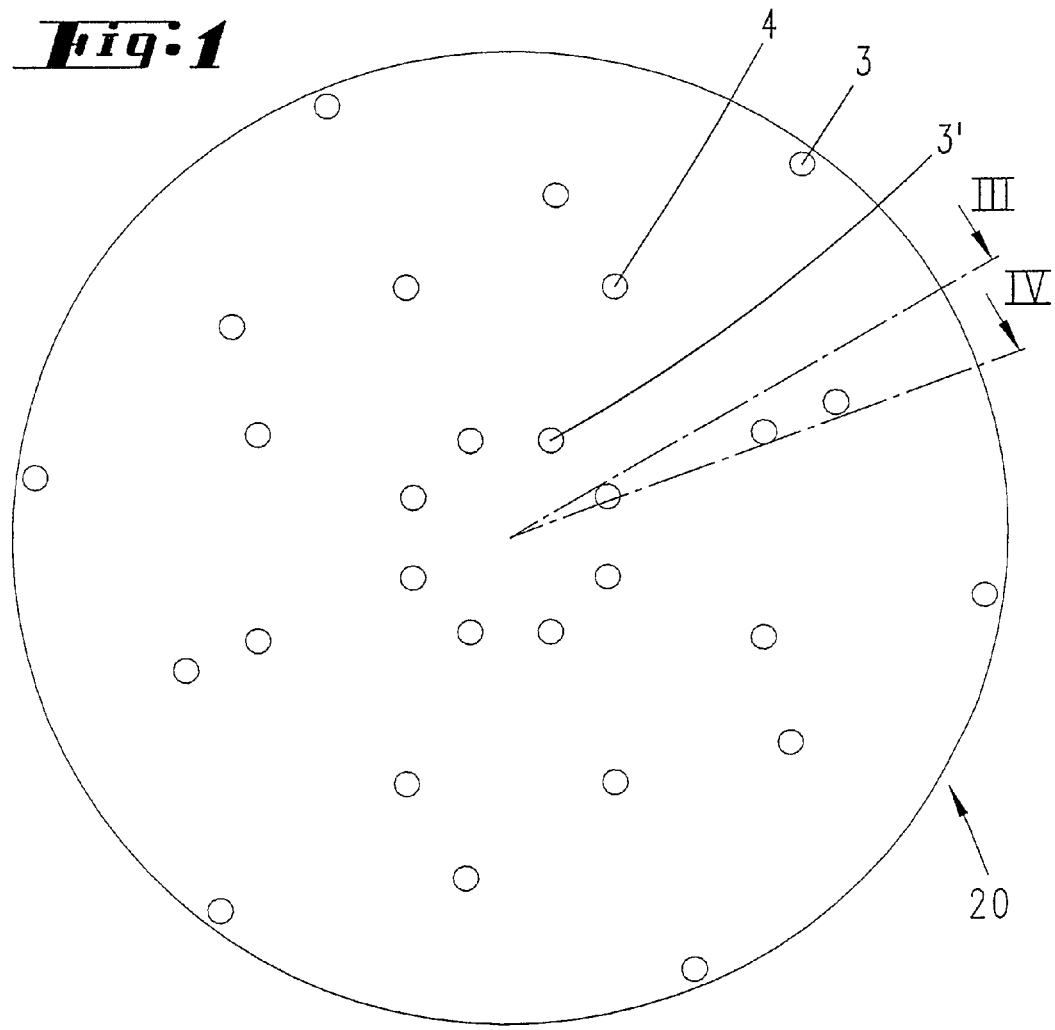
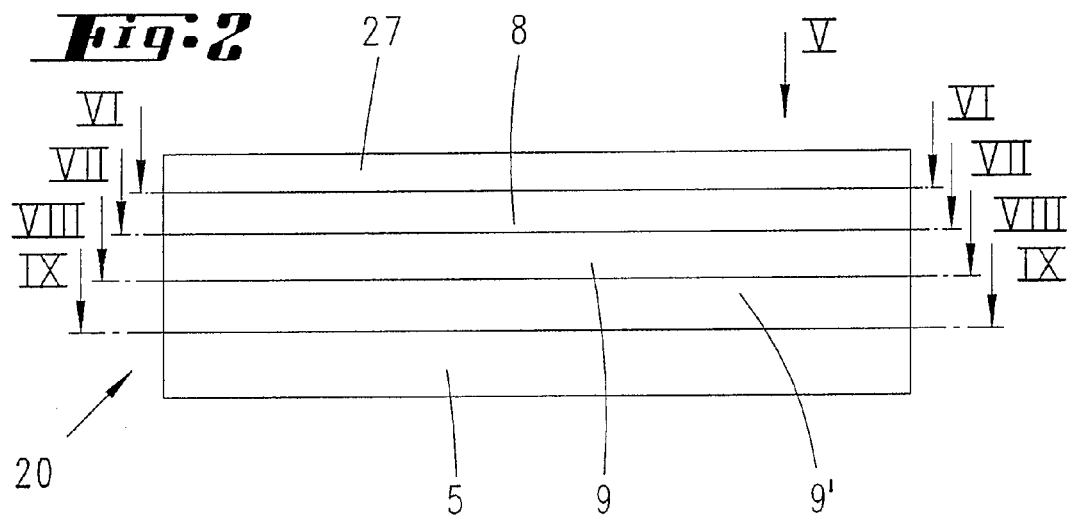

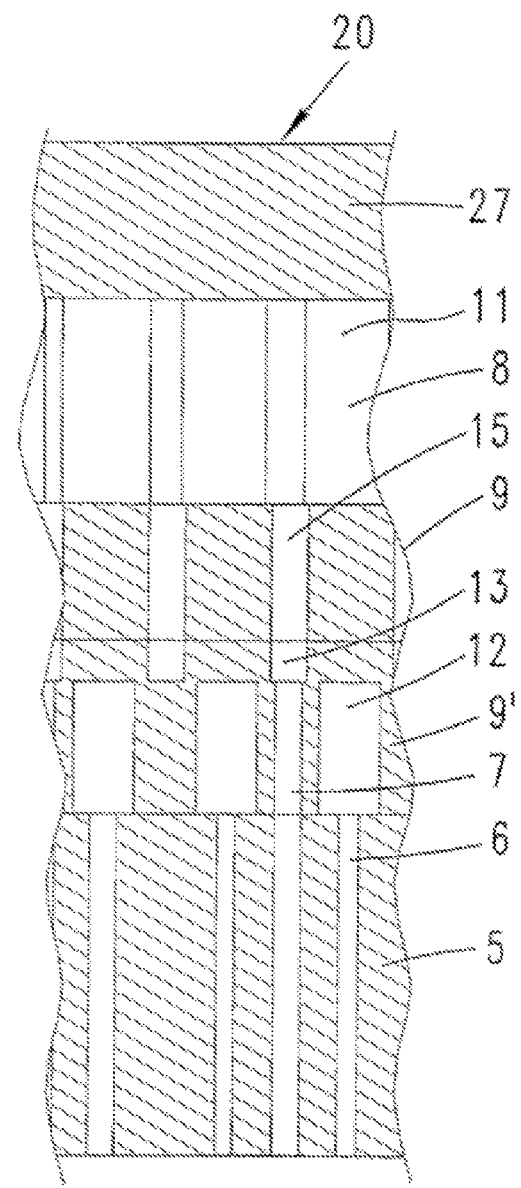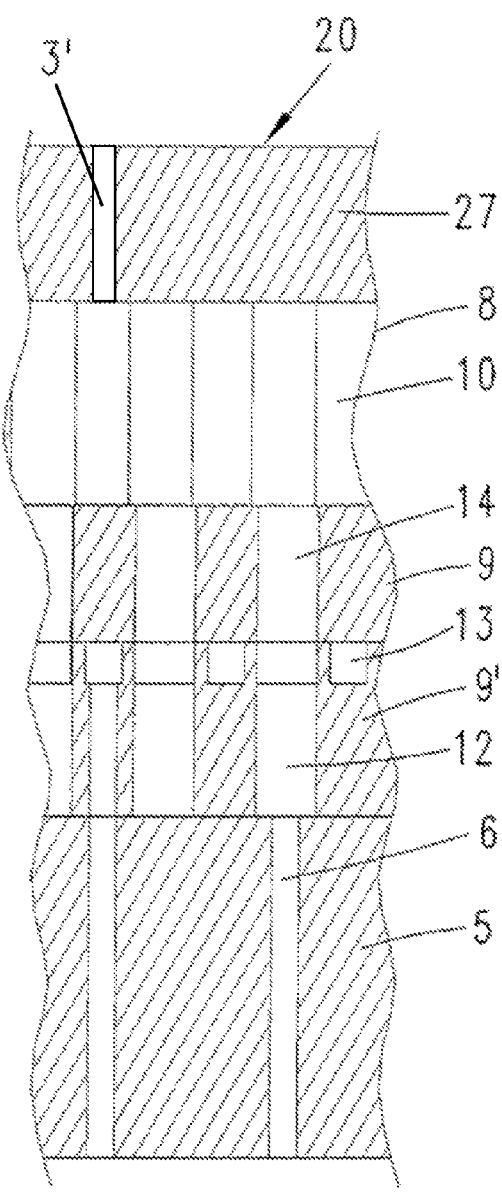

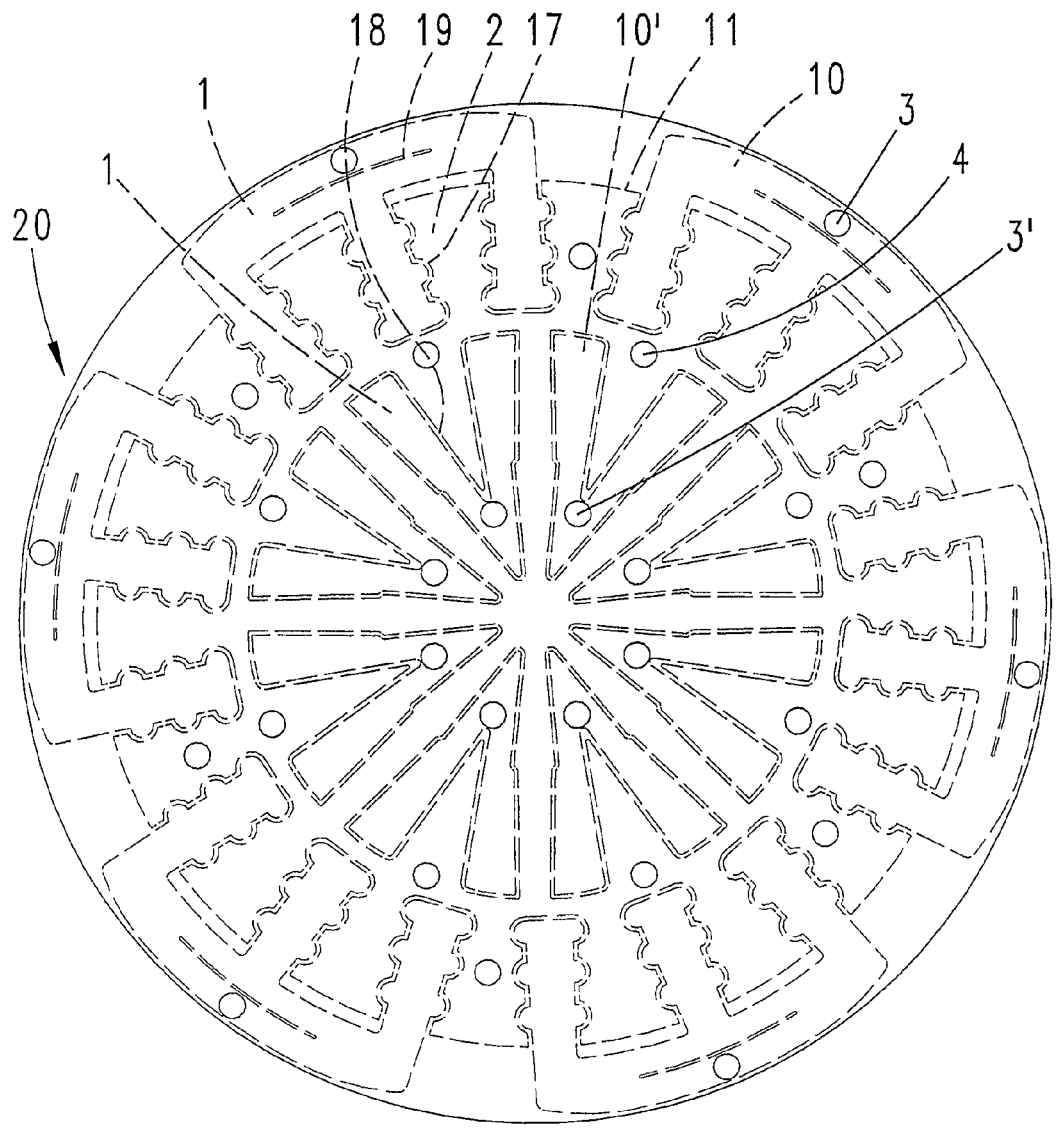

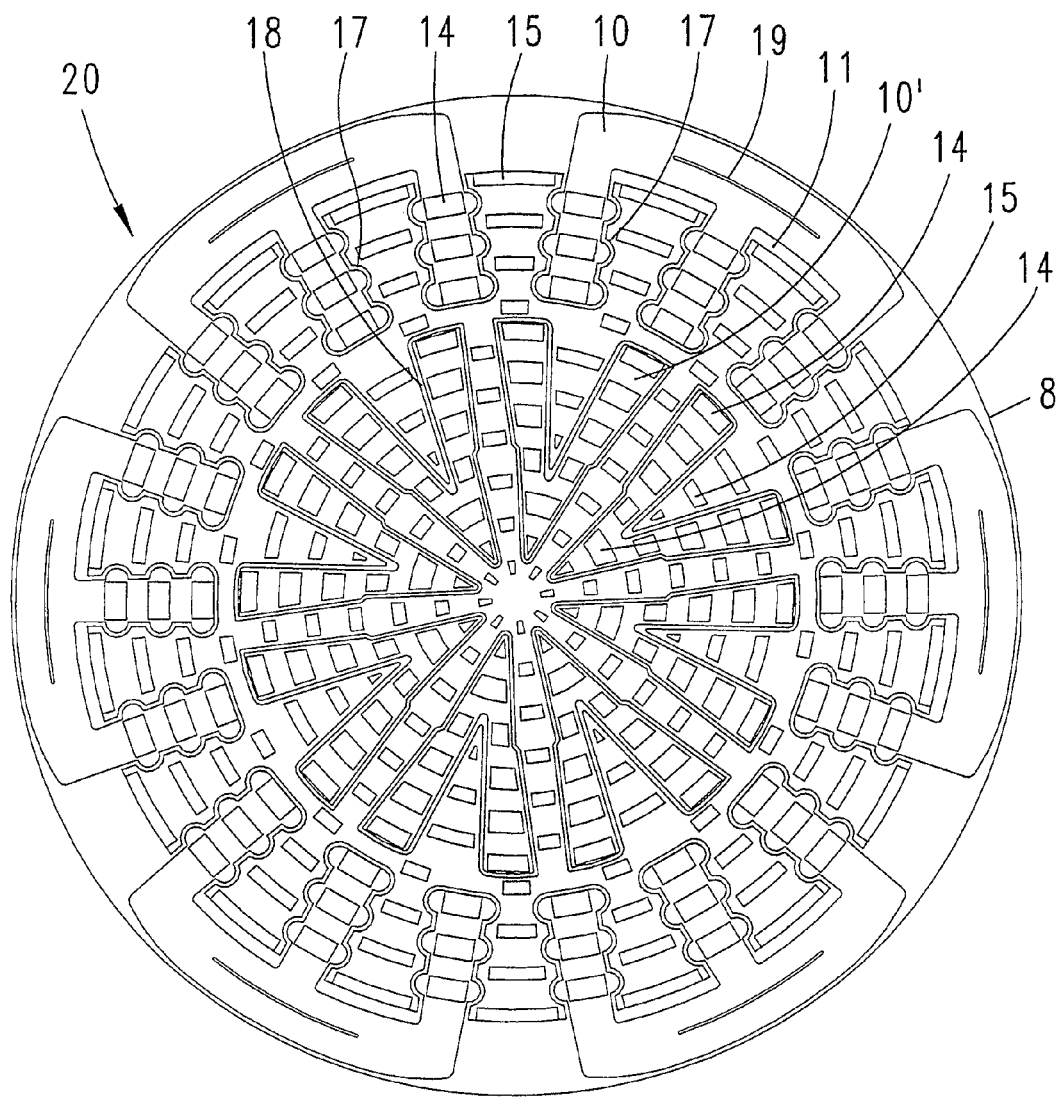

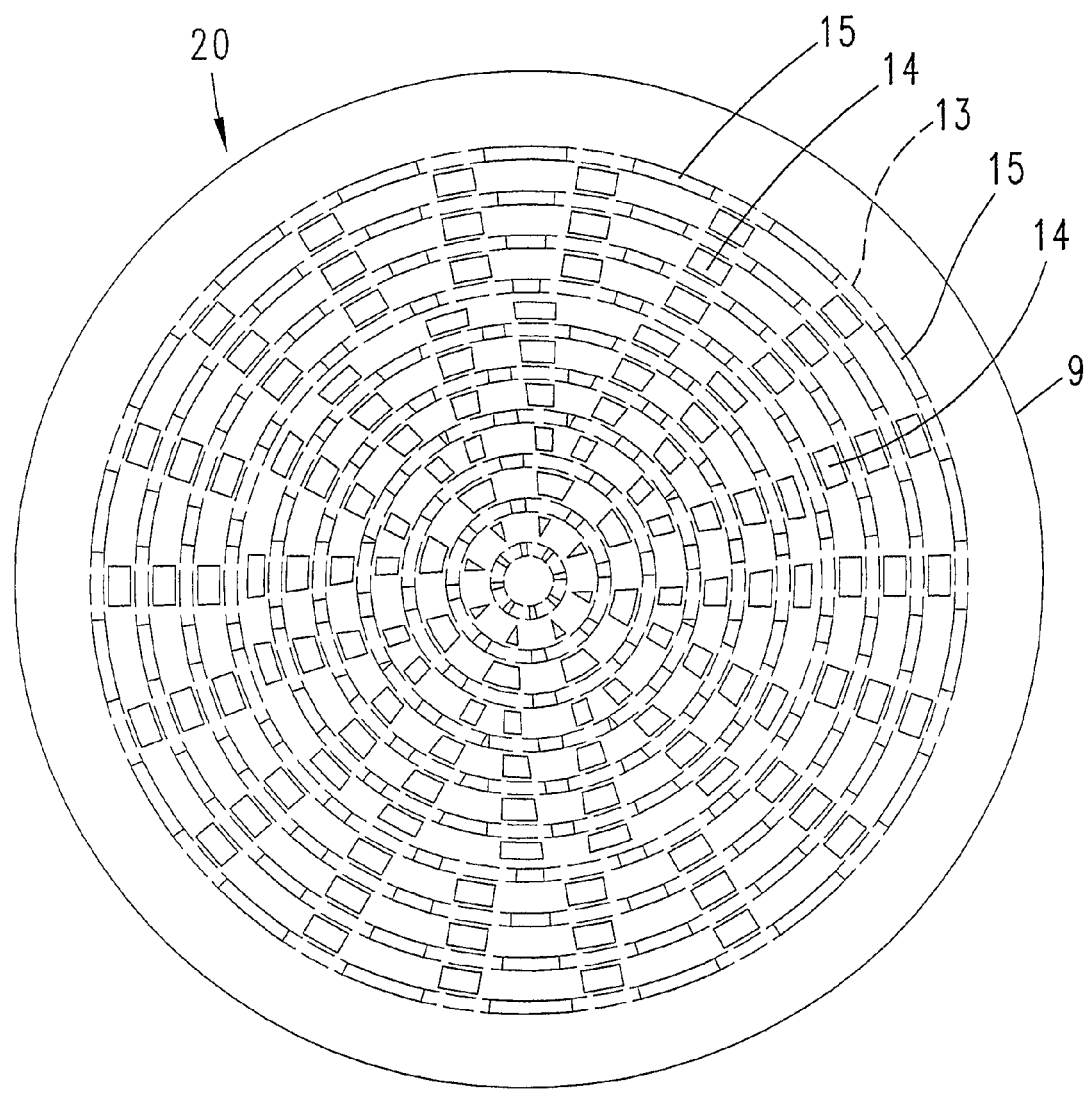

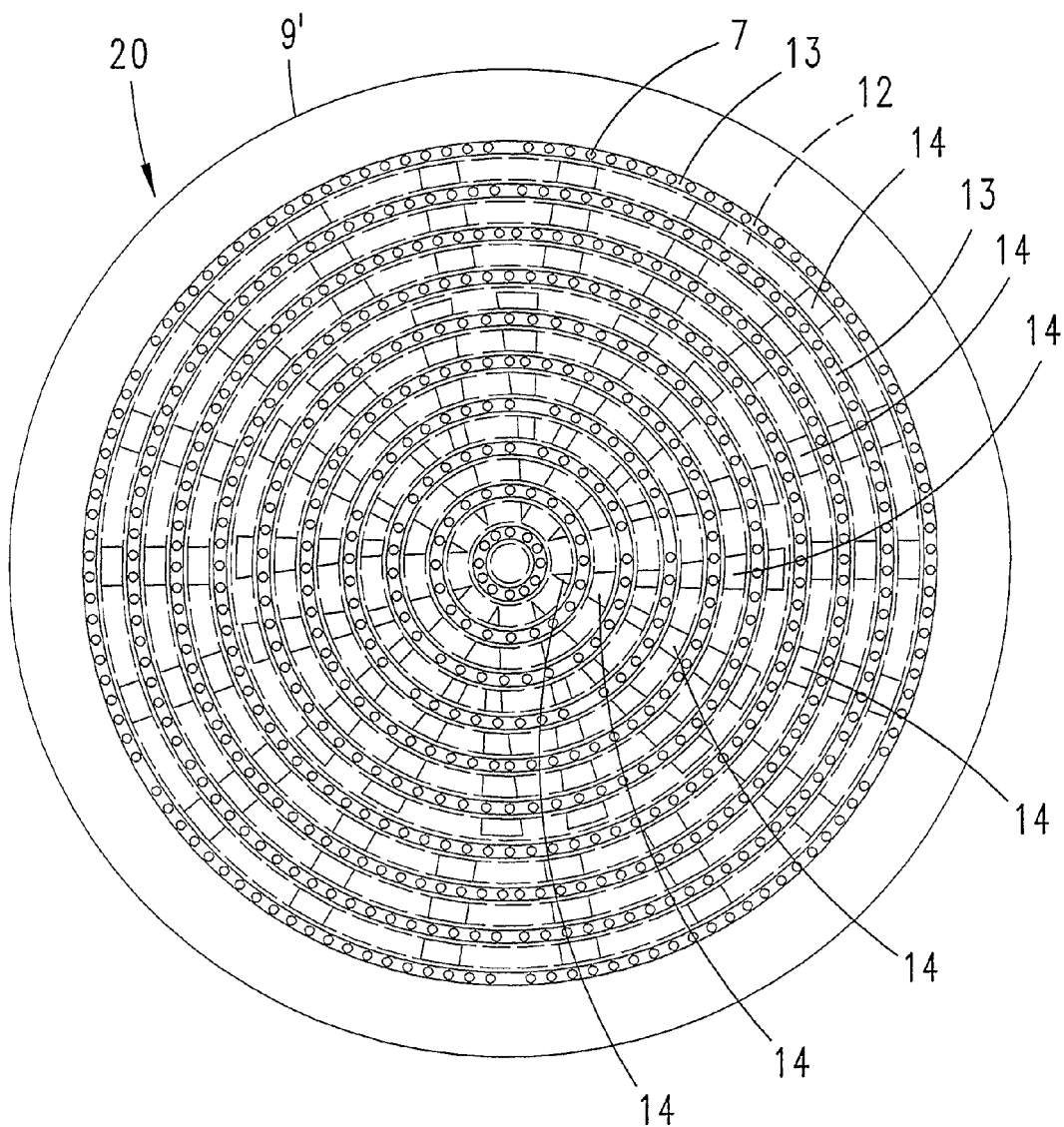

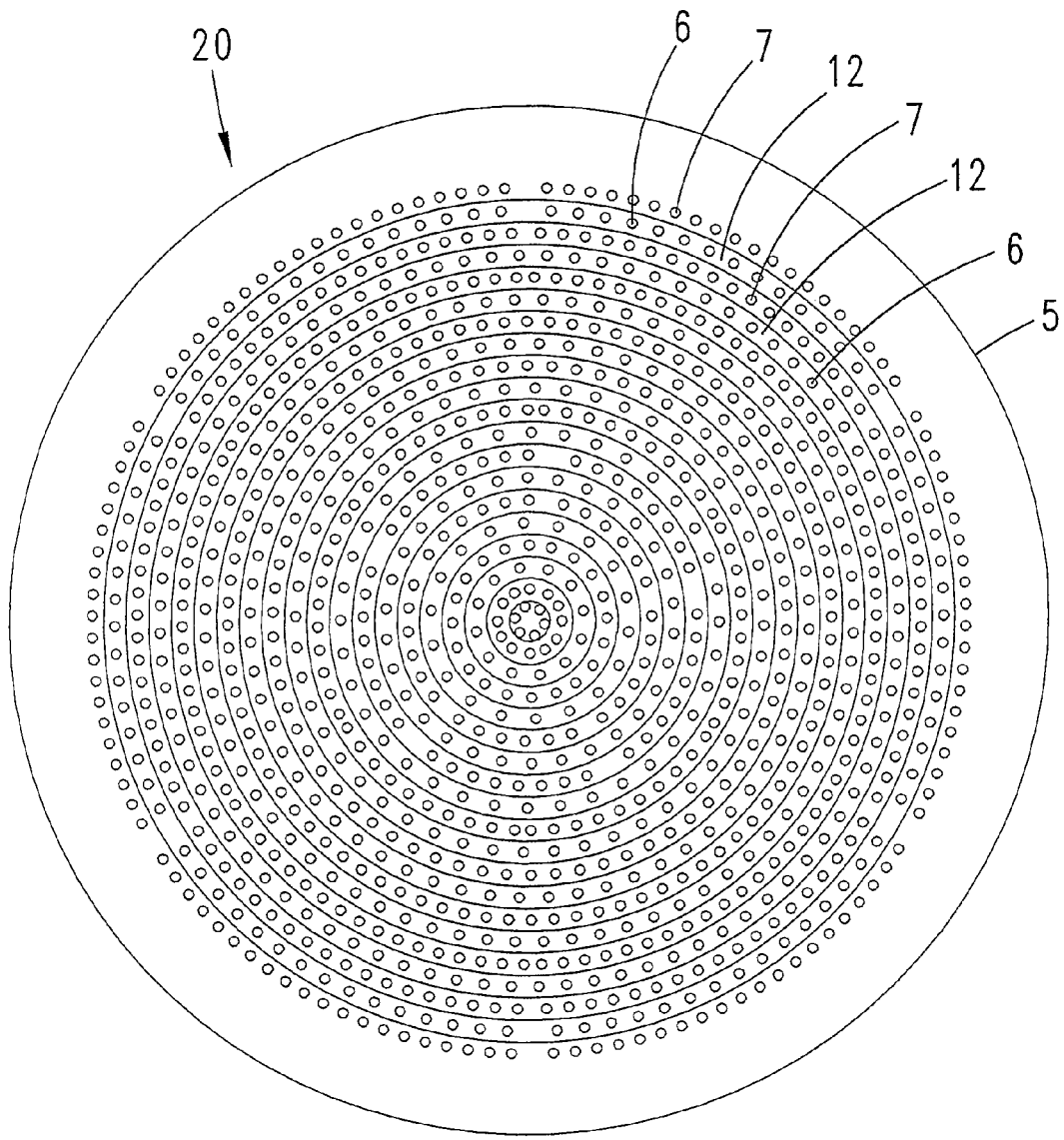

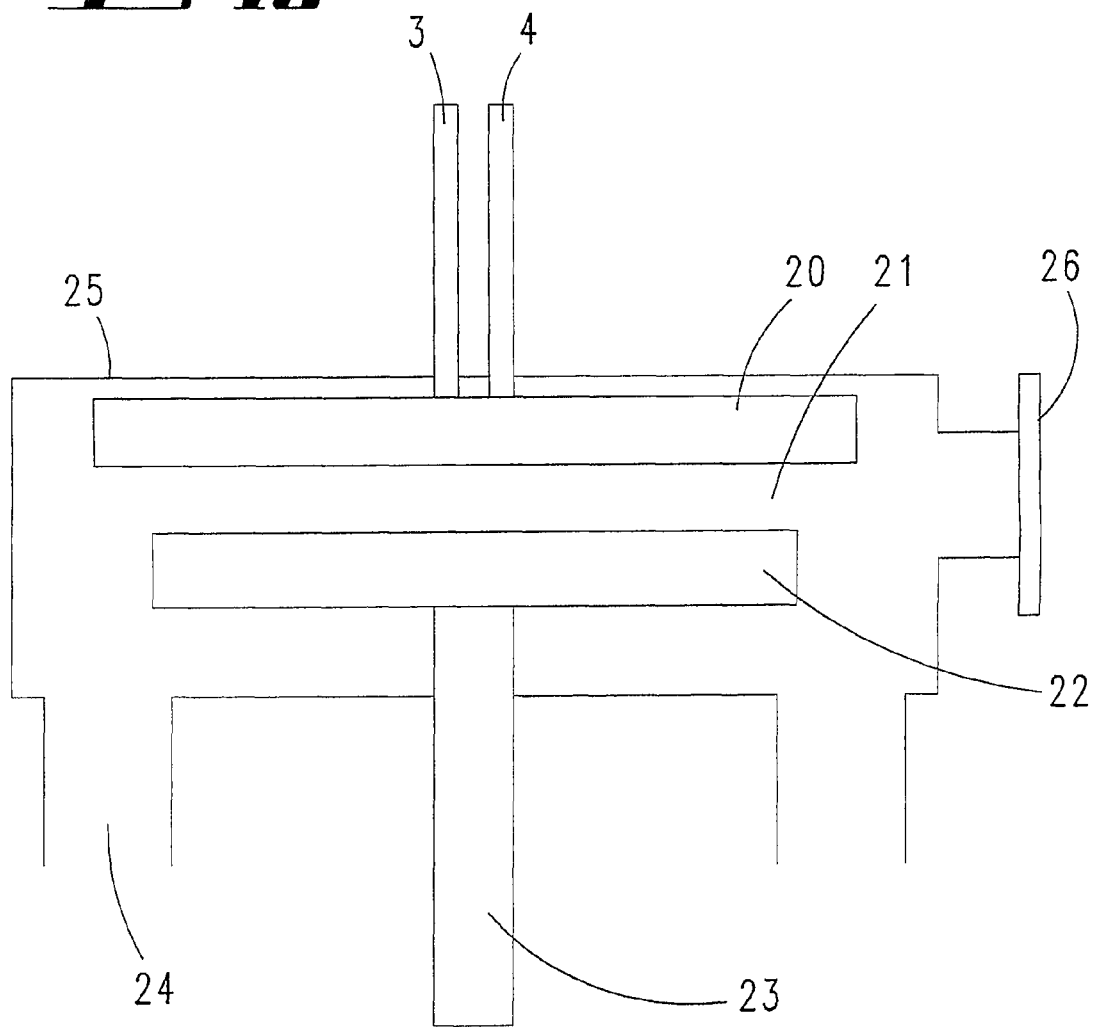

GAS DISTRIBUTOR WITH PRE-CHAMBERS ARRANGED IN PLANES

CROSS REFERENCES TO RELATED APPLICATIONS

The present patent application is a National Stage under 35 USC 365 and claims priority to PCT International Application No. PCT/EP2006/050049 filed Jan. 5, 2006, incorporated herein by reference, which claims priority benefit from German Application No.: 10 2005 004 312.7 filed Jan. 31, 2005.

FIELD OF THE INVENTION

The invention relates to a gas distributor in a CVD or OVPD reactor with two or more gas volumes, into each of which a supply line for a process gas opens out, each gas volume being connected to a multiplicity of outlet openings for the respective process gas, which open out in the bottom (5) of the gas distributor.

BACKGROUND

A generic gas distributor is known from EP 0 687 749 A1. The gas distributor is located in a CVD reactor and forms the top of a process chamber, the bottom of which forms a substrate holder, on which one or more substrates are disposed in order to be coated, the materials that form the layer being introduced into the process chamber by means of the gas distributor. The gas distributor known from EP 687 749 A1 has a number of gas volumes disposed one above the other, which are respectively supplied with a different process gas. Each of the gas volumes has outlet channels, which open out in the bottom of the gas distributor. The two gas volumes lie one above the other and extend over the entire cross-sectional area of the gas distributor. The supply lines to the gas volumes are located at the periphery, so that the gas emerging from the gas distributor may have non-homogeneities.

Gas distributors of the generic type are used in the case of MOCVD. Metal Organic Chemical Vapor Deposition (MOCVD) is a widely used method for depositing single- or multi-component oxidic insulating layers (dielectrics), semiconductor layers, passivation layers or electrically conducting layers. For this purpose, a number of reactive gases or gaseous precursors are mixed, fed to a reaction chamber in order to deposit a layer on a heated substrate, and then pumped out from the reaction chamber. Among the reactors there are various geometric arrangements, for example horizontal and vertical reactors. In the case of horizontal reactors, the substrate surface is parallel to the direction of flow of the mixed precursors and reactive gases. In vertical reactors, the corresponding gas mixture impinges vertically on the substrate surface and flows off to the outer edges of the substrate before it leaves the reaction chamber. In general, rotation of the substrate can be used to increase the uniformity of the layer that is deposited.

In order to ensure homogeneous deposition on the substrate, thorough mixing of the various gaseous precursors or reactive gases must be ensured. In order to achieve this, there are methods by which the gas mixing is achieved at an early stage before introduction into the reaction chamber. This is suitable for precursors and reactive gases that are stable at the temperature and pressure in the gas distributor.

However, the precursors used are often very reactive and may thereby cause preliminary gas phase reactions. This leads to deposition on, and consequently progressive contamination of, gas-carrying parts upstream of the substrate, causes particle formation, and consequently particle coating of the substrate, changes the reaction chemistry at the substrate and reduces the efficiency of the growth process.

In the case of the aforementioned multi-chamber gas distributor, see also U.S. Pat. No. 5,871,586, the various gaseous components are supplied in separate chambers and fed directly to the substrate via a multiplicity of openings. The mixing only takes place in the region directly at the substrate. In the case of such a multi-chamber gas distributor, feed-through pipes lead from a first chamber into a gas distributor outlet and thereby cross through at least one other chamber. As a result, in the chambers there are narrow flow cross sections around the feed-through pipes. This leads to non-homogeneous flows and an increased pressure drop within a chamber. These problems increase with greater diameters of the gas distributor, since the number of feed-through pipes increases with the surface area. Furthermore, the production of the gas distributor becomes very much more complicated as the number of feed-through pipes increases, since each feed-through pipe has to be gastight at each separating wall of a chamber. Such a gas distributor is scarcely scalable and therefore cannot be produced or used in practice for the coating of relatively large substrates, e.g. 200 mm, 300 mm. After it has been produced, it is no longer possible in practice for such a gas distributor to be opened, for example for maintenance purposes.

In the case of some processes for oxidic insulating layers (dielectrics), passivation layers or electrically conducting layers, it has been found that this type of mixing does not lead to sufficiently homogeneous layers on the substrate. For some applications, the requirement for the non-homogeneity of the deposited layers on the substrate surface is, for example, <+1%.

Many gaseous metal-organic precursors are only stable as such within a small temperature range. (Metal-organic precursors may contain at least one metal atom and/or also at least one semiconductor/semimetal atom (such as for example Si, Ge)). At temperatures that are too low, condensation takes place; at temperatures that are too high, decomposition takes place even before mixing with other reactive gases. It is therefore necessary to keep the gas distributor at a homogeneous temperature.

On the basis of the generic prior art, an object of the invention is to improve the way in which a gas distributor operates.

The object is achieved by the invention specified in the claims, each individual one of the claims in principle representing independent solutions to achieve the object and it being possible for each claim to be combined with any other claim as an independent technical solution.

Claim 1 provides first and foremost that the gases are distributed in a radial direction in a first plane and then distributed in a circumferential direction in a second plane, lying under said first plane, before they leave the gas distributor through the outlet openings at the bottom of it.

Claim 2 provides first and foremost that each gas volume is formed by a number of pre-chambers, the pre-chambers lying in a common first plane, and a multiplicity of gas distributing chambers that are respectively associated with a gas volume being provided in a second plane, forming the bottom of the gas distributor, the pre-chambers and the gas distributing chambers of each gas volume being connected by connecting channels. Preferably, all the pre-chambers are disposed in a common first plane. In a development of the invention, it is provided that the pre-chambers that belong to one gas volume are at different radial distances from the center of the gas distributor. It is also provided that the pre-chambers belonging to one gas volume are disposed such that they are distributed in a circumferential direction. The pre-chambers of two different gas volumes may engage in one another in the manner of a comb. The prongs of the comb may in this case be continuations of each individual chamber that run in a radial direction. The gas distributing chambers may concentrically surround the center of the gas distributor. It is provided that a gas distributing chamber is connected to a number of pre-chambers. A pre-chamber may in turn also be connected to a number of gas distributing chambers. Preferably, the connecting channels between the individual chambers lie in a third plane, which is located between the first plane and the second plane. The invention provides a multi-chamber gas distributor wherein the gaseous precursors, which may comprise metals or semiconductors, and the reactive gases are introduced separately into a gas distributor. The gas distributor has a high degree of temperature homogeneity, in order to avoid condensation, decomposition and preliminary reactions of the precursors with the chemically reactive gases. In this respect, the smallest possible pressure drop on passing through the gas distributor is advantageous for the gaseous precursors. This is the case in particular when an evaporator is provided upstream of the gas distributor. With this evaporator, liquid or solid starting materials can be made to evaporate into process gases. In a preferred arrangement, the gas distributor is used in a CVD reactor. In this case, the gas distributor extends substantially parallel to a substrate holder. The substrate holder and the gas distributor then form the boundaries of a process chamber. In this case, the gas distributor may be located above, below or to the side of the substrate holder. Preferably, the gas distributor provides the upper boundary of the process chamber. The bottom of the gas distributor then forms the top of a process chamber. The bottom of the process chamber is the substrate holder. One or more substrates may be disposed on the substrate holder. The gas distributor has an overall appearance similar to a shower head. The process gases exit from the openings disposed at the bottom of the gas distributor, in order to react with one another in the gas phase or else on the substrate, a layer being deposited on the substrate. The mass flows of the gases can be set in such a way that the gases have a dwell time in the gas distributor of 10 ms to 16 ms. In this case, the individual chambers of the gas volumes are configured in such a way that this applies to overall gas flows of 300 to 1200 sccm. The pressure drop on flowing through the gas distributor is preferably <2.5 mbar, with a total flow of 1200 sccm. The temperature non-homogeneity along the gas flow path is preferably less than 10%. When the gaseous precursors exit from the gas outlet openings of the gas distributor, there is a standard deviation for the flow distribution of 0.3% to 0.9%. Nitrogen, hydrogen, helium and argon or some other noble gas or inert gas are to be preferred as carrier gases for the precursors. In a preferred configuration, gaseous precursors or starting materials that are liquid at room temperature or metal-organic starting materials are used. These are converted into the gas phase in special evaporation processes and are then fed to the gas distributor. There they enter the gas volume associated with them. The gas flow is split into a number of partial gas flows, with which the individual pre-chambers are supplied. Via the pre-chambers, the process gas then passes through the connecting channels into the gas distributing chamber circularly surrounding the center of the gas distributor. In the process, gases from different pre-chambers of the same gas volume enter one and the same gas distributing chamber. A reactive gas, for example $O_2$, $O_3$, $NO_2$, $H_2O$, $NH_3$ or $H_2$, is introduced into a second gas volume. This gas volume may have one or more pre-chambers. The pre-chamber or the pre-chambers are likewise connected via connecting channels to gas distributing chambers disposed concentrically around the center of the gas distributor. The gas distributing chambers belonging to the individual gas volumes may alternate in a radial direction. With the apparatus according to the invention, multi-component, oxidic insulating layers, dielectrics, passivation layers, semiconducting layers or electrically conducting layers or layer sequences are deposited on at least one substrate.

BRIEF DESCRIPTION OF THE DRAWINGS

An exemplary embodiment of the invention is explained on the basis of the accompanying drawings, in which:

FIG. 1 shows the plan view of a gas distributor,

FIG. 2 shows the side view of the gas distributor,

FIG. 3 shows a section according to the line III-III in FIG. 1,

FIG. 4 shows a section according to the line IV-IV in FIG. 1,

FIG. 5 shows a section according to the line V-V in FIG. 2, only the structures of the plane lying directly underneath being respectively represented, FIG. 6 shows a section according to the line VI-VI in FIG. 2, only the structures lying directly underneath the sectional plane being illustrated, FIG. 7 shows a section according to the line VII-VII in FIG. 2, only the structures lying directly underneath the sectional plane being respectively illustrated, FIG. 8 shows a section according to the line VIII-VIII in FIG. 2, the structures lying directly underneath the sectional plane being respectively illustrated, FIG. 9 shows a section according to the line IX-IX in FIG. 2, only the structures lying directly underneath the sectional plane being respectively illustrated, and FIG. 10 shows, in a highly schematic representation, a CVD reactor in cross-section with a gas distributor as represented in the previous figures.

DETAILED DESCRIPTION

The detailed configuration of the gas distributor 20 is described below with reference to FIGS. 1 to 8.

Within the gas distributor 20 there are two gas volumes 1, 2, which are separate from each other. The first process gas, comprising a metal component, is introduced into the gas volume 1 via the supply lines 3, 3'. A multiplicity of different supply lines 3, 3' are provided. The second process gas, which is a reactive gas, is introduced into the second gas volume 2 via a multiplicity of supply lines 4.

As can be gathered in particular from FIG. 5 the first gas volume comprises a multiplicity of pre-chambers 10, which are disposed in the manner of a comb, the prongs of the comb extending substantially in a radial direction of the gas distributor having a circular outline. Extending between these prongs of the pre-chambers 10 are fingers of a second pre-chamber 11, which is associated with the second gas volume. The fingers of the pre-chamber 11 are separated from the prongs of the pre-chamber 10 by a wall 17.

Provided at a radial spacing from the pre-chambers 10 are pre-chambers 10', which likewise form prongs of a comb extending in a radial direction. Between these prongs of the pre-chamber 10' are portions of the pre-chamber 11. The same process gas is introduced into the pre-chamber 10' as into the pre-chamber 10, so that the pre-chambers 10, 10' belong to one gas volume 1. However, it is also possible to introduce different process gases into the pre-chambers 10, 10'. This is not preferred however.

The center of the gas distributor is formed by the pre-chamber 11, so that the pre-chambers 10' form an approximately V-shaped outline in cross-section. The pre-chambers 10 form a three-pronged comb, the prongs being directed radially inward. The spaces separating the individual portions.

It is important that the individual pre-chambers 10, 10', 11 alternate in a circumferential direction of the gas distributor, for which purpose the separating walls 17 are provided, separating the pre-chambers 10 and 11 from one another. The walls 18 separate the pre-chambers 10', 11 from one another. In the region of the supply line opening 3, the pre-chamber 10 also has a baffle 19.

The gas distributor has a construction comprising a number of disks, the disks lying one above the other. The uppermost disk 27 forms a cover. This covers the pre-chambers 10, 10', 11. The pre-chambers 10, 10', 11 are associated with a disk lying underneath the cover. They are machined into this disk, for example by milling.

The bottoms of the pre-chambers 10, 10', 11, which lie in a common plane, have downwardly directed openings, which form connecting channels 14, 15. These connecting channels 14, 15, disposed in plane 9, connect the plane 8 of the pre-chambers 10, 10', 11 to plane 9', in which gas distributing chambers 12, 13 are disposed.

The pre-chambers 10, 10' are connected to a multiplicity of gas distributing chambers 12, surrounding the center of the gas distributor, by means of connecting channels 14 running in a vertical direction. These gas distributing chambers 12 are annular channels, which are disposed in a plane 9' associated with a further disk. The annular structure of the gas distributing chambers 12 can be produced by milling.

In the bottom of the annular gas distributing chambers 12, surrounding the center, there are a multiplicity of outlet openings 6. These are formed by bores, which open out in the bottom plate 5 of the gas distributor and through which the first process gas can exit.

The connecting channels 15 disposed in the bottom of the pre-chamber 11 connect the pre-chamber 11 to a multiplicity of gas distributing chambers 13, likewise concentrically surrounding the center of the gas distributor. These chambers lie in a plane 9', which is disposed underneath the plane 9, so that the gas distributing chambers 12 and the gas distributing chambers 13 are disposed at different elevations within plane 9'.

The gas distributing chambers 13 also have openings at the bottom, which form outlet openings 7 for the second process gas.

In a radial direction, annular gas distributing chambers 12 for the first process gas and annularly disposed gas distributing chambers 13 for the second process gas alternate with one another.

As already mentioned, the gas distributor may consist of a suitable metal. It preferably has a multilayered construction. The temperature of the gas distributor may be controlled and it may have, around the part comprising the gas flow paths, a periphery with a thermal mass for temperature homogenization. Consequently, it has a high degree of temperature homogeneity along the gas flow paths.

It is considered to be important that a radial distribution of the first process gas and of the second process gas is achieved in a first distributing plane and that a circumferential distribution of the two process gases is achieved in a further plane, the process gases exiting separately from one another from the outlet openings 6, 7. The circumferential distribution of the two process gases may additionally take place in two different planes.

It is also advantageous that the gases are supplied to the individual pre-chambers 10, 10', 11 in a multiplicity of supply lines 3, 3', 4.

Apart from the MOCVD mentioned above, the gas distributor serves in particular for the distribution of gases in a process chamber in which a condensation process is carried out for the coating of substrates. In particular, the processes involve depositing oxidic insulating layers (dielectrics), passivation layers or electrically conducting layers on semiconducting, conducting or insulating substrates.

FIG. 10 shows the basic construction of a CVD reactor, in particular an MOCVD reactor. It has a reaction chamber 25, which is vacuum-tight with respect to the outside world. To carry out the process, the susceptor 22 is rotated by means of a rotatable spindle 23. The process chamber 21 may be loaded with substrates through a flange, which forms the loading and unloading opening 26; the gaseous precursors and reactive gases are introduced into the gas distributor 20 through the separate supply lines 3 and 4. Process gases that are not used are pumped away through the gas outlet 24. The gas distributor 20 serves for the homogeneous exiting of the process gases through the outlet openings 6, 7 on its underside. Inside the process chamber 21, the gases are mixed with one another.

For an operating range from 300 to 1200 seem of gas flow, the dwell time of the gases in the gas distributor is 10 ms to 60 ms. For the gaseous precursors, with an overall flow of 1.2 l/min there is an overall pressure drop on flowing through the gas distributor of <2.5 mbar. For many processes, a temperature non-homogeneity along the gas flow path over the diameter of the gas distributor of less than 10% of the gas distributor temperature is advantageous. For a gas flow of 450 sccm of argon as the carrier gas for the gaseous precursors and 300 sccm of oxygen as the reactive gas, the following results are obtained with a pressure in the reactor space 21 of 2 mbar: when the gaseous precursors exit from the outlet openings 6 of the gas distributor 20, there is a standard deviation for the flow distribution of 0.3% for the chamber 10 and of 0.9% for the chamber 10'. For the reactive gases of the chamber 11, when they exit from the outlet openings 7 of the gas distributor there is a standard deviation of 0.4%. Apart from nitrogen, hydrogen, helium and argon come into consideration for example as an inert carrier gas.

All disclosed features are (in themselves) pertinent to the invention. The disclosure content of the associated/accompanying priority documents (copy of the prior application) is also hereby incorporated in full in the disclosure of the application, including for the purpose of incorporating features of these documents in claims of the present application.

What is claimed is:

1. A gas distributor in a CVD or OVPD reactor with two or more gas volumes (1, 2), into each of which a supply line (3, 4) for a process gas opens out, each gas volume (1, 2) being connected to a multiplicity of outlet openings (6, 7) for a respective one of the process gases, which open out in a bottom (5) of the gas distributor, the process gases respectively being first distributed in a radial direction in a first plane (8), remote from the bottom (5), and then distributed in a circumferential direction in a second plane (9'), adjacent to the bottom (5), and flowing through connecting channels (14, 15), which are located in a third plane (9) disposed between the first plane and the second plane, and a multiplicity of gas distributing chambers (12, 13) that are respectively associated with the gas volumes (1, 2) and are connected to the outlet openings (6, 7) being provided in the second plane (9'), the gas distributor characterized in that the gas volumes (1, 2) have pre-chambers (10, 10', 11), at least one pre-chamber of one gas volume and at least one pre-chamber of another gas volume lying at a common elevation in the first plane (8), the pre-chambers (10, 10', 11) of the two gas volumes (1, 2) forming continuations like prongs of a comb that extend in the radial direction and engage with one another in a manner of prongs of a comb, the comb-like continuations that lie next to one another in the circumferential direction being separated from one another by a wall (17).

2. The gas distributor according to claim 1, further characterized in that pre-chambers (10, 10', 11) associated with one of the gas volumes (1, 2) are at different radial distances from a center of the gas distributor.

3. The gas distributor according to claim 1, further characterized in that different ones of the pre-chambers (10) of a first one of the gas volumes are disposed separately from one another in the circumferential direction.

4. The gas distributor according to claim 1, further characterized in that each pre-chamber (10, 10', 11) is fed by more than one supply line (3, 4).

5. The gas distributor according to claim 1, further characterized in that a first one of the gas volumes is provided for feeding a gaseous, in particular metal-containing or semiconductor-containing, starting material and a second one of the gas volumes is provided for a chemically reactive gas, in particular an oxygen, nitrogen or hydrogen compound.

6. The gas distributor according to claim 1, further characterized in that the gas distributing chambers (12, 13) concentrically surround a center of the gas distributor.

7. The gas distributor according to claim 1, further characterized in that one or more of the gas distributing chambers (12, 13) are connected to a number of the pre-chambers (10, 10', 11) by the connecting channels (14, 15).

8. The gas distributor according to claim 1, further characterized in that at least one of the pre-chambers is connected to a number of the gas distributing chambers by the connecting channels.

9. The gas distributor according to claim 1, further characterized in that the gas distributing chambers (12, 13) are disposed at different elevations within the second plane (9').

10. The gas distributor according to claim 1, further characterized in that a temperature of the gas distributor is controlled.

11. The gas distributor according to claim 1, further characterized in that the gas distributor is produced from solid metal parts, which form a thermal mass for temperature homogenization.

12. The gas distributor according to claim 1, further characterized in that the gas distributor comprises a number of disks placed on one another, into which the pre-chambers (10, 10', 11), the gas distributing chambers (12, 13), the connecting channels (14, 15) and the outlet openings (6, 7) are machined.

13. The gas distributor according to claim 1, further characterized in that portions of the at least one pre-chamber of one gas volume and portions of the at least one pre-chamber of another gas volume alternate with one another in a circumferential direction of the gas distributor.

14. The gas distributor according to claim 1, further characterized in that the gas distributing chambers of one gas volume and the gas distributing chambers of another gas volume alternate with one another in a radial direction of the gas distributor.

* * * * *